United States Patent
Camiolo

(10) Patent No.: US 11,675,021 B2
(45) Date of Patent: Jun. 13, 2023

(54) TEST APPARATUS FOR USB-PD DEVICE

(71) Applicant: STMicroelectronics (Grenoble 2) SAS, Grenoble (FR)

(72) Inventor: Jean Camiolo, St Egreve (FR)

(73) Assignee: STMicroelectronics (Grenoble 2) SAS, Grenoble (FR)

( * ) Notice: Subject to any disclaimer, the term of this patent is extended or adjusted under 35 U.S.C. 154(b) by 431 days.

(21) Appl. No.: 16/787,358

(22) Filed: Feb. 11, 2020

(65) Prior Publication Data

US 2020/0256925 A1   Aug. 13, 2020

(30) Foreign Application Priority Data

Feb. 12, 2019   (FR) ...................................... 1901412

(51) Int. Cl.
  *G01R 31/40*   (2020.01)
  *G06F 1/26*   (2006.01)
  *G06F 13/42*   (2006.01)

(52) U.S. Cl.
  CPC ............... *G01R 31/40* (2013.01); *G06F 1/26* (2013.01); *G06F 13/4282* (2013.01); *G06F 2213/0026* (2013.01)

(58) Field of Classification Search
  CPC ..... G01R 31/40; G01R 19/16538; G06F 1/26; G06F 13/4282; G06F 2213/0026; G06F 1/263; G06F 1/266; G06F 1/28; G06F 1/305; H02J 7/00032
  See application file for complete search history.

(56) References Cited

U.S. PATENT DOCUMENTS

| | | | |
|---|---|---|---|
| 8,818,192 B1* | 8/2014 | Smith | H04B 10/808 398/171 |
| 2013/0138776 A1* | 5/2013 | Yamashita | H04L 67/06 709/219 |
| 2013/0290765 A1* | 10/2013 | Waters | G06F 1/263 713/340 |
| 2015/0268688 A1* | 9/2015 | Leinonen | G06F 13/409 307/147 |
| 2016/0274168 A1 | 9/2016 | Cabot et al. | |
| 2017/0269148 A1 | 9/2017 | Sporck et al. | |
| 2017/0364114 A1* | 12/2017 | Sporck | H02J 7/0071 |
| 2018/0196486 A1 | 7/2018 | Lin et al. | |

FOREIGN PATENT DOCUMENTS

| CN | 102175920 A | * | 9/2011 | |
|---|---|---|---|---|
| CN | 202197119 U | * | 4/2012 | |
| CN | 102918855 B | * | 11/2015 | ............. G09G 3/003 |
| CN | 204813888 U | * | 12/2015 | |
| CN | 107525980 A | * | 12/2017 | ............. G01R 31/00 |

(Continued)

OTHER PUBLICATIONS

INPI Search Report and Written Opinion for FR 1901412 dated Jan. 21, 2020 (9 pages).

*Primary Examiner* — Alexander Satanovsky
*Assistant Examiner* — Asm Fakhruddin
(74) *Attorney, Agent, or Firm* — Crowe & Dunlevy

(57) ABSTRACT

An apparatus is adapted to test a power supply device of the USB-PD type which includes at least one USB Type-C connector. The USB Type-C connector is intended to be connected to the power supply device to be tested. The device is separate from the apparatus.

18 Claims, 9 Drawing Sheets

(56) References Cited

FOREIGN PATENT DOCUMENTS

| | | | | |
|---|---|---|---|---|
| CN | 107525980 A | | 12/2017 | |
| CN | 207396620 U | * | 5/2018 | |
| CN | 207396620 U | | 5/2018 | |
| CN | 108663590 A | * | 10/2018 | |
| CN | 108663590 A | | 10/2018 | |
| DE | 112012006663 T5 | * | 3/2015 | ............. G01R 31/60 |

* cited by examiner

TEST APPARATUS FOR USB-PD DEVICE

PRIORITY CLAIM

This application claims the priority benefit of French Application for Patent No. 1901412, filed on Feb. 12, 2019, the content of which is hereby incorporated by reference in its entirety to the maximum extent allowable by law.

TECHNICAL FIELD

The present disclosure relates generally to power supply devices of the Universal Serial Bus Power Delivery (USB-PD) type.

BACKGROUND

USB Type-C connectors are more and more frequently integrated in various types of power supply devices and/or devices to be supplied with power. There is a need for verification of the proper operation of devices of the USB-PD type.

SUMMARY

One embodiment addresses drawbacks of known power supply devices of the USB-PD type.

One embodiment provides an apparatus, configured to test a power supply device of the USB-PD type, including at least one USB Type-C connector to be connected to the power supply device to be tested, the power supply device being separate from the apparatus.

According to an embodiment, the apparatus and the power supply device operate in an autonomous manner with respect to each other.

One embodiment provides a test method for testing a device of the USB-PD type, wherein the test is implemented by an apparatus as described. The test includes at least the following successive steps: verifying that the voltage of a power supply terminal is lower than a first threshold; verifying the role of the connected device; simulating the device to be supplied with power; generating requests representative of power supply configurations; verifying the compatibility of the power supply configurations proposed by the device with standardized power supply configurations; and verifying the compatibility of the device with the proposed power supply configurations.

According to an embodiment, the apparatus may include a battery.

According to an embodiment, at least one USB Type-C connector of the apparatus is configured to be connected to a device to be tested and supplied with power.

According to an embodiment, the apparatus or the method includes verifying the compatibility of the power supply configurations supported by the tested device to be supplied with power with standardized power supply configurations.

According to an embodiment, the apparatus includes at least one second USB Type-C connector.

According to an embodiment, the apparatus is configured to be simultaneously connected to a power supply device and to a device to be supplied with power, so as to form an interface.

According to an embodiment, the apparatus is able to: save the negotiated power supply configurations; continuously monitor the power supply terminal voltage of the power supply device and of the device to be supplied with power; monitor the current flowing from the power supply device toward the device to be supplied with power; and interrupt the connection between the two devices in the event of an overvoltage.

According to an embodiment, the apparatus includes an output device for rendering the results. According to an embodiment, the output device is a display screen.

According to an embodiment, the output device is a Bluetooth module.

According to an embodiment, the output device is an assembly of LEDs.

According to an embodiment, the apparatus includes an emitter circuit for communicating with the cable.

According to an embodiment, the apparatus is configured to determine a connected cable type.

According to an embodiment, the apparatus includes a dual-role port.

BRIEF DESCRIPTION OF THE DRAWINGS

The foregoing features and advantages, as well as others, will be described in detail in the following description of specific embodiments given by way of illustration and not limitation with reference to the accompanying drawings, in which.

DETAILED DESCRIPTION

Like features have been designated by like references in the various figures. In particular, the structural and/or functional features that are common among the various embodiments may have the same references and may have identical structural, dimensional and material properties.

For the sake of clarity, the operations and elements that are useful for an understanding of the described embodiments herein have been illustrated and described in detail. In particular, the assembly elements of the apparatus will not be described in detail.

Unless indicated otherwise, when reference is made to two elements that are connected together, this indicates a direct connection without any intermediate elements other than conductors, and when reference is made to two elements that are linked or coupled together, this indicates that these two elements can be connected or be linked or coupled by way of one or more other elements.

In the following disclosure, unless indicated otherwise, when reference is made to absolute positional qualifiers, such as the terms "front", "back", "top", "bottom", "left", "right", etc., or to relative positional qualifiers, such as the terms "above", "below", "higher", "lower", etc., or to qualifiers of orientation, such as "horizontal", "vertical", etc., reference is made to the orientation shown in the figures.

Unless specified otherwise, the expressions "around", "approximately", "substantially" and "on the order of" signify within 10%, and preferably within 5%.

Functions described as being performed by a USB-PD compatible USB Type-C connector or by the apparatus itself are performed by processing circuitry included within those devices, as will be understood by those of skill in the art, and need no further description below.

Figure 1:
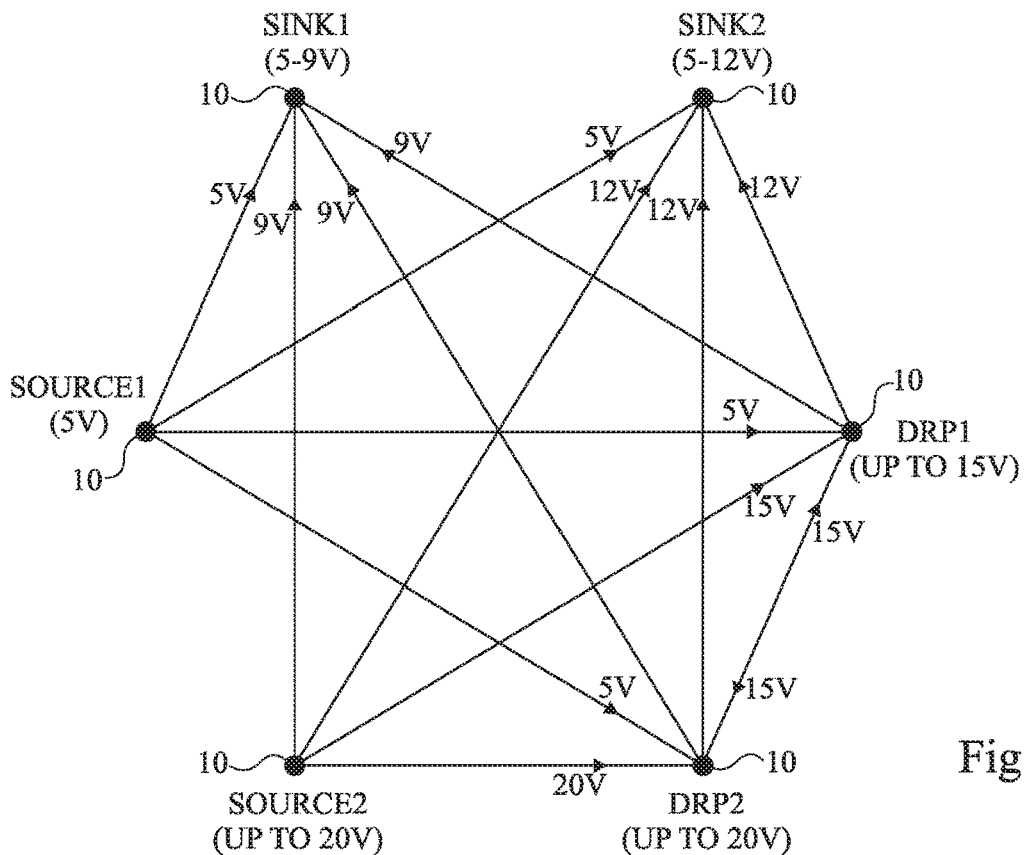
FIG. 1 illustrates, in the form of a diagram, an example of operational connections between power supply devices and devices to be supplied with power.

FIG. 1 illustrates, in the form of a diagram, an example of operational connections between power supply devices and devices to be supplied with power.

Such devices each comprise at least one USB-PD compatible USB Type-C connector. Using this standardized connector, it is possible for each device to be connected to any other device having the same connector. Each device is depicted in FIG. 1 by a node 10.

In the example shown in FIG. 1, the arbitrary case of six devices 10 is assumed, including: two power supply devices SOURCE1 and SOURCE2; two devices to be supplied with power SINK1 and SINK2; and two dual-role devices DRP1 and DRP2, furnished with a dual-role port making it possible for these devices to supply power or be supplied with power via a same port or connector. In other words, these two devices DRP1 and DRP2 are at the same time devices to be supplied with power and power supply devices.

Of the power supply devices, a first device SOURCE1 is capable of providing a power supply voltage of 5V. This can be, for example, a charger for a mobile telephone. A second device SOURCE2 is capable of providing a power supply voltage up to 20V. This can be, for example, a charger for a portable computer.

Of the devices to be supplied with power, a first device SINK1 supports a voltage from 5 to 9V. This can be, for example, a hard drive. A second device SINK2 supports a voltage from 5 to 12V. This can be, for example, a drone.

Of the dual-role devices, a first device DRP1 is capable of providing and of supporting a power supply voltage up to 15V. This can be, for example, a tablet. A second device DRP2 is capable of providing and of supporting a power supply voltage up to 20V. This can be, for example, a portable computer.

FIG. 1 illustrates operational couplings between the different devices 10. In this example:

the first power supply device SOURCE1 is connected to the two devices to be supplied with power SINK1 and SINK2 and to the two dual-role devices DRP1 and DRP2;

the second power supply device SOURCE2 is connected to the two devices to be supplied with power SINK1 and SINK2 and to the two dual-role devices DRP1 and DRP2;

the first device to be supplied with power SINK1 is connected to the two power supply devices SOURCE1 and SOURCE2 and to the two dual-role devices DRP1 and DRP2;

the second device to be supplied with power SINK2 is connected to the two power supply devices SOURCE1 and SOURCE2 and to the two dual-role devices DRP1 and DRP2;

the first dual-role device DRP1 is connected to the two power supply devices SOURCE1 and SOURCE2, and to the two devices to be supplied with power SINK1 and SINK2, and to the second dual-role device DRP2, that is to say to each device; and the second dual-role device DRP2 is connected to the two power supply devices SOURCE1 and SOURCE2, to the two devices to be supplied with power SINK1 and SINK2, and to the first dual-role device DRP1, that is to say to each device.

In practice, a single coupling of two elements exists at a given moment.

Using the USB-PD standard, it is possible for each device 10 to set the role (power supply, to be supplied with power, or dual-role) of further devices 10 to which it is connected. It is possible by this, as illustrated in FIG. 1, for each device capable of providing a power supply voltage (SOURCE1, SOURCE2, DRP1 or DRP2) to supply the device capable of receiving a power supply voltage (SINK1, SINK2, DRP1 or DRP2) to which it is connected. More specifically, each device capable of providing a power supply voltage (SOURCE1, SOURCE2, DRP1 or DRP2) detects the maximum voltage supported by the device capable of receiving a power supply voltage (SINK1, SINK2, DRP1 or DRP2) to which it is connected. In cases where the maximum supported voltage is lower than or equal to the maximum voltage that the device is capable of providing, the device provides the maximum supported voltage. In cases where the maximum supported voltage exceeds the maximum voltage that the device is capable of providing, the device provides the maximum supported voltage that it can provide.

In the example illustrated in FIG. 1, the first power supply device SOURCE1 can supply power at a voltage of 5V to the first device to be supplied with power SINK1, to the second device to be supplied with power SINK2, to the first dual-role device DRP1, or to the second dual-role device DRP2.

Similarly, the second power supply device SOURCE2 can supply power at a voltage of 9V, 12V, 15V or 20V respectively to the first device to be supplied with power SINK1, to the second device to be supplied with power SINK2, to the first dual-role device DRP1, or to the second dual-role device DRP2.

The first device to be supplied with power SINK1 can be supplied with power at a voltage of 5V by the first power supply device SOURCE1. It can, by contrast, be supplied with power at a voltage of 9V by the second power supply device SOURCE2, the first dual-role device DRP1, or the second dual-role device DRP2.

Similarly, the second device to be supplied with power SINK2 can be supplied with power at a voltage of 5V by the first power supply device SOURCE1. It can, by contrast, be supplied with power at a voltage of 12V by the second power supply device SOURCE2, the first dual-role device DRP1, or the second dual-role device DRP2.

The first dual-role device DRP1 can supply power at a voltage of 9V, 12V or 15V respectively to the first device to be supplied with power SINK1, to the second device to be supplied with power SINK2 or to the second dual-role device DRP2.

The first dual-role device DRP1 can be supplied with power at a voltage of 5V by the first power supply device SOURCE1, or at a voltage of 15V either by the second power supply device SOURCE2 or by the second dual-role device DRP2.

Similarly, the second dual-role device DRP2 can supply power at a voltage of 9V, 12V or 15V respectively to the first device to be supplied with power SINK1, to the second device to be supplied with power SINK2 or to the first dual-role device DRP1.

The second dual-role device DRP2 can be supplied with power at a voltage of 5V, 15V or 20V respectively by the first power supply device SOURCE1, the first dual-role device DRP1 or the second power supply device SOURCE2.

Figure 2:
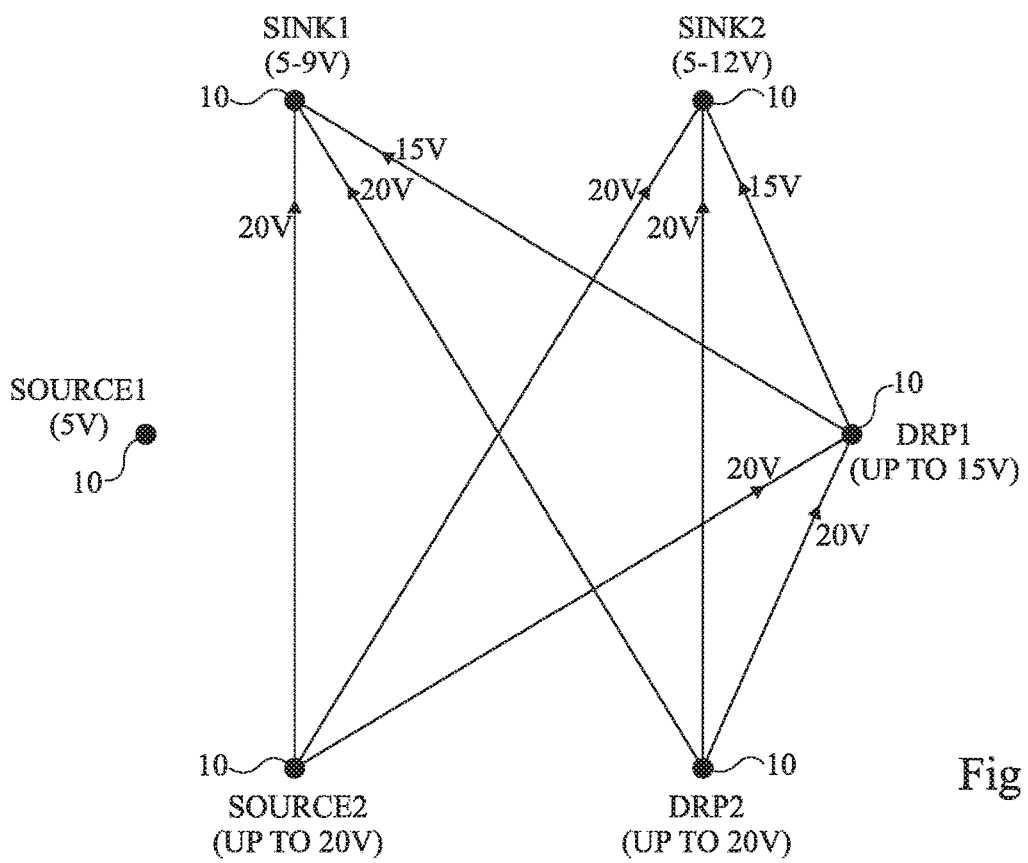
FIG. 2 depicts, via a diagram, couplings subject to possible overvoltage during the connection between power supply devices and devices to be supplied with power.

FIG. 2 depicts, via a diagram, couplings subject to possible overvoltage during the connection between power supply devices and devices to be supplied with power.

The devices 10 illustrated here are identical to those shown in FIG. 1. The voltages depicted by arrows are the potential cases of overvoltage when each device capable of providing a power supply voltage (SOURCE1, SOURCE2, DRP1 or DRP2) provides the maximum voltage that it can provide to the device capable of receiving a power supply voltage (SINK1, SINK2, DRP1 or DRP2) to which it is connected.

Although it is possible with the USB-PD standard for each device to check the role of the device to which it is connected, it is not possible to verify the proper operation of the latter. For example, in the event of a bad connection of the USB Type-C connector, or in the event of defects in the power supply terminal, the voltage provided by a power supply device can exceed the maximum value supported by the device to be supplied with power to which it is connected, or even exceed 20V in extreme cases.

Taking the example shown in FIG. 2:

the second power supply device SOURCE2 risks supplying power at a voltage of 20V to the first device to be supplied with power SINK1, to the second device to be supplied with power SINK2, or to the first dual-role device DRP1;

the first dual-role device DRP1 risks supplying power at a voltage of 15V to the first device to be supplied with power SINK1, or to the second device to be supplied with power SINK2; and the second dual-role device DRP2 risks supplying power at a voltage of 20V to the first device to be supplied with power SINK1, to the second device to be supplied with power SINK2, or to the first dual-role device DRP1.

Figure 3:
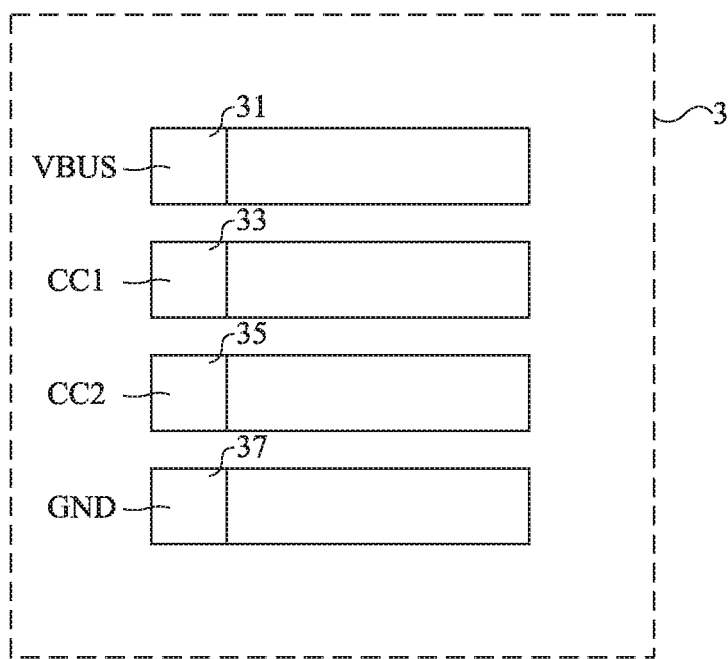
FIG. 3 schematically illustrates a USB-PD connector.

FIG. 3 illustrates, very schematically, a USB-PD connector.

A USB-PD connector 3 comprises, in a standardized manner, four terminals including two terminals 31 and 37 configured to convey a power supply signal (potentials VBUS and GND) and two terminals 33 and 35 configured to convey data signals CC1 and CC2.

Figure 4:
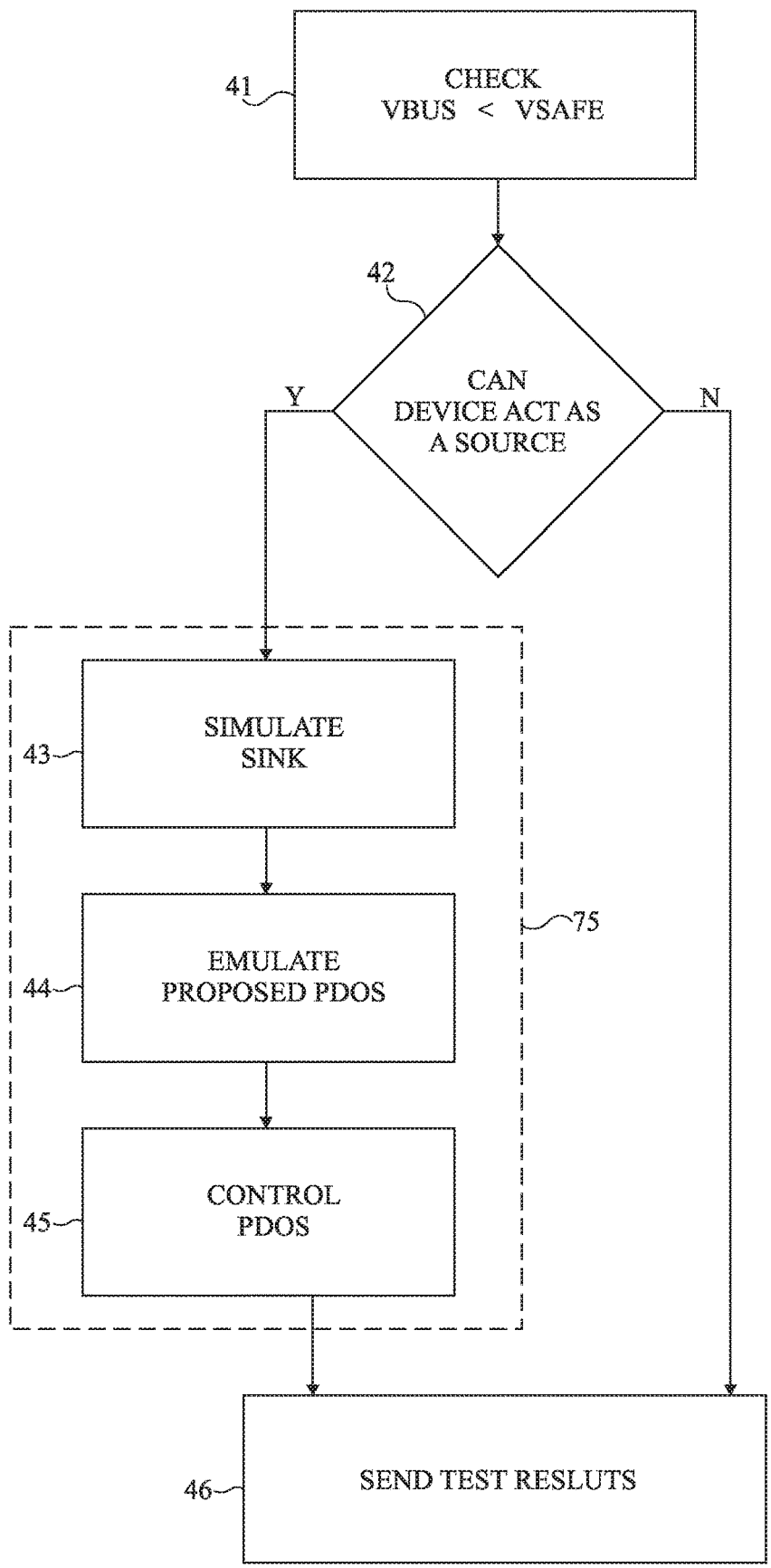
FIG. 4 is a flowchart illustrating steps of an embodiment of a test procedure for a USB-PD compatible power supply device.

FIG. 4 is a flowchart illustrating steps of an embodiment of a test procedure for a USB-PD compatible power supply device.

This test procedure is implemented by an apparatus, for example an element known by the term "dongle", which is adapted to test a power supply device of the USB-PD type. The apparatus includes processing circuitry 6 and comprises at least one USB Type-C connector, configured to be connected to the power supply device to be tested. The device is separate from the apparatus.

In a first step (block 41, CHECK VBUS<VSAFE), once a device is connected, the apparatus verifies that the voltage VBUS of a power supply terminal (31, FIG. 3) of the connector is lower than a first threshold (VSAFE), also known as a safety value (Vsafe0V), for example of 0.9 volt. If the voltage VBUS is higher than the safety value Vsafe0V, the apparatus stops the test procedure and outputs an error.

In a second step (block 42, CAN DEVICE ACT AS SOURCE), the apparatus verifies that the role or function of the device to which it is connected is to supply power.

In order to verify that the function of the tested device is to supply power, the apparatus determines the role of the device. The role of the connected device, if applicable via a USB Type-C cable, can be: a power supply device; a device to be supplied with power; a dual-role device; or a sole USB Type-C cable (not connected to other devices), in other words an energy or data transmission device.

If the function of the connected device is not to supply power (output N of block 42), i.e., if the apparatus is connected to a sole USB cable or to a device to be supplied with power, the test procedure moves directly to a sixth step (block 46, SEND TEST RESULTS), which will be described herein.

If the function of the connected device is to supply power (output Y of block 42), i.e., if the apparatus is connected to a power supply device or to a dual-role device, the test procedure moves to a third step (block 43, SIMULATE SINK).

In this third step 43, the apparatus simulates a device having the opposite function of that of the tested device. In other words, the apparatus poses as a device to be supplied with power vis-à-vis the power supply device.

In a fourth step (block 44, EMULATE PROPOSED PDOS), the apparatus generates a request representative of power supply configurations (Power Data Object, PDO). By this, it is possible for it to determine the power supply configurations, voltage and current pairs, proposed by the power supply device.

For example, for a 27-Watt power supply device, the proposed power supply configurations are: 5 volts/3 amperes; 9 volts/3 amperes; and 15 volts/1.8 amperes.

For a same example 27-Watt power supply device 27, two additional power supply configurations are proposed: 12 volts/2.25 amperes; and 20 volts/1.35 amperes.

In a fifth step (block 45, CONTROL PDOS), the apparatus checks that the proposed power supply configurations are compatible with standardized power supply configurations. If compatibility exists, the apparatus is then supplied with power by the power supply device. The proposed power supply configurations are tested in turn.

During these tests, an undervoltage value (Under voltage, UVLO) and an overvoltage value (Over Voltage, OVLO) are associated with the tested power supply configuration PDO. In the case of a power supply configuration PDO comprising a voltage of 5 volts, the undervoltage value UVLO is equal to 4.25 volts and the overvoltage value OVLO is equal to 5.75 volts. For each further power supply configuration PDO, the undervoltage value UVLO is equal to the value of the voltage of the tested power supply configuration PDO minus ten percent. Similarly, the overvoltage value OVLO is equal to the value of the voltage of the tested power supply configuration PDO minus ten percent.

The apparatus verifies if the power supply provided by the power supply device is comprised between the undervoltage value UVLO and the overvoltage value OVLO of the tested power supply configuration.

In the sixth step (block 46, SEND TEST RESULTS), the apparatus provides the results of the test procedure. The method of outputting the results of the test procedure can take different forms, examples of which will be described in relation to FIG. 8. The results comprise: the role of the tested device; the power supply configurations proposed by the tested device; the compatibility of the device with the standardized power supply configurations; and the compatibility of the device with the proposed power supply configurations.

If the function of the connected device is not to supply power (output N of block 42), i.e., if the apparatus is connected to a sole USB cable or to a device to be supplied with power, the apparatus proceeds directly to the issue of the results of the test which comprise the role (to be supplied with power or cable) of the tested device.

Figure 5:
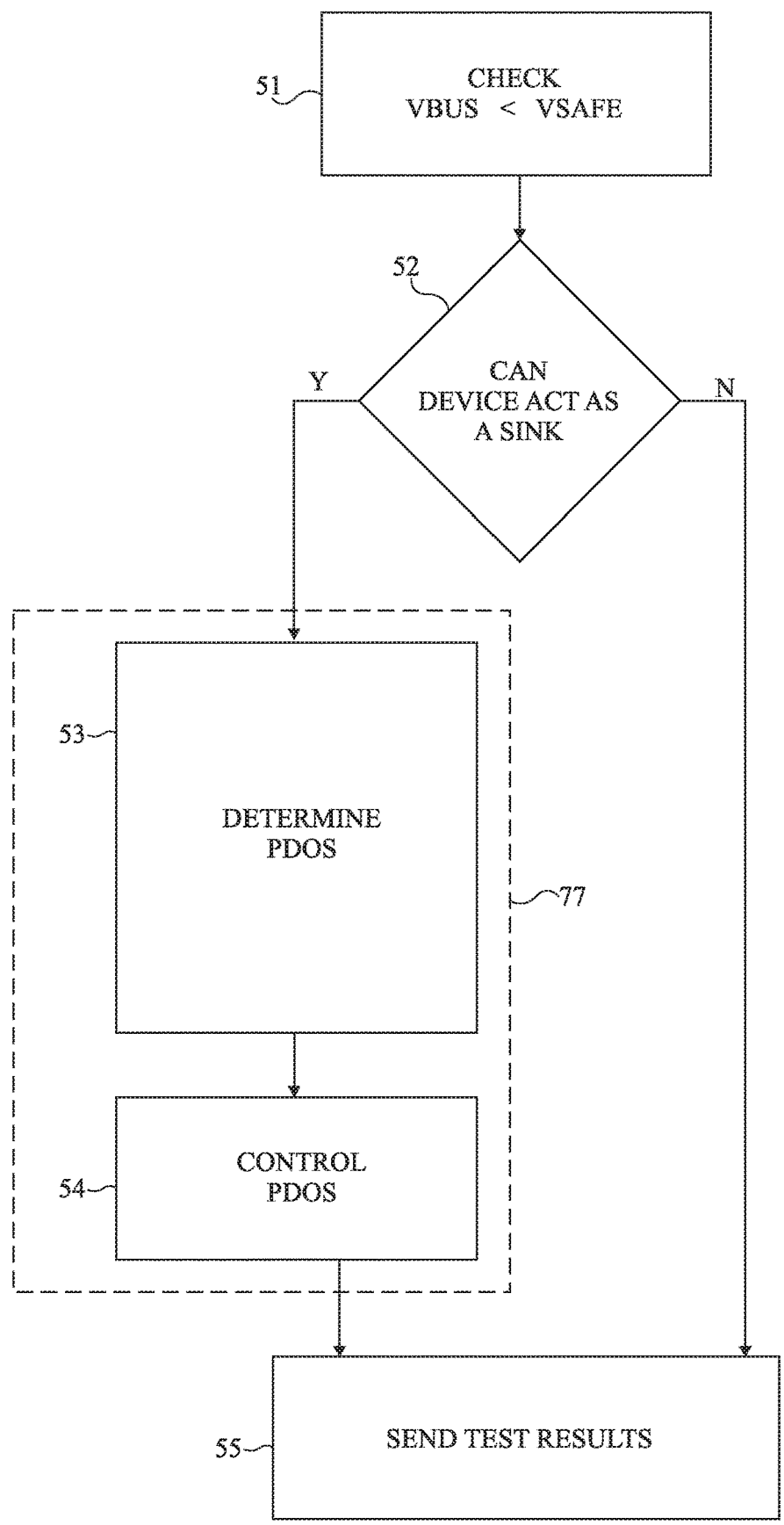
FIG. 5 is a flowchart illustrating steps of an embodiment of a test procedure for a USB-PD compatible device to be supplied with power.

FIG. 5 is a flowchart illustrating steps of an embodiment of a test procedure for a USB-PD compatible device to be supplied with power.

This test procedure is implemented by an apparatus, for example an element known by the term "dongle", which is adapted to test a device to be supplied with power of the USB-PD type. The apparatus comprises at least one USB Type-C connector, configured to be connected to the device to be supplied with power to be tested. The device is separate from the apparatus.

In a first step (block 51, CHECK VBUS<VSAFE), once a device is connected, the apparatus verifies that the voltage VBUS of a power supply terminal (31, FIG. 3) of the connector is lower than a first threshold (VSAFE), also known as a safety value (Vsafe0V), for example of 0.9 volt. If the voltage VBUS is higher than the safety value Vsafe0V, the apparatus stops the test procedure and outputs an error.

In a second step (block 52, CAN DEVICE ACT AS SINK), the apparatus verifies that the role or function of the device to which it is connected is to be supplied with power.

In order to verify that the function of the device is to be supplied with power, the apparatus determines the role of the device. The role of the connected device, if applicable via a USB Type-C cable, can be: a power supply device; a device to be supplied with power; a dual-role device; or a sole USB Type-C cable, in other words an energy or data transmission device.

If the function of the connected device is not to be supplied with power (output N of block 52), i.e., if the apparatus is connected to a sole USB cable or to a power supply device, the test procedure moves directly to a fifth step (block 55, SEND TEST RESULTS), which will be described herein.

If the function of the connected device is to be supplied with power (output Y of block 52), i.e., if the apparatus is connected to a device to be supplied with power or to a dual-role device, the test procedure moves to a third step (block 53, DETERMINE PDOS).

In this third step 53, the apparatus generates a request for power supply configurations PDO addressed to the device. A device adapted to the USB-PD standard that receives such a request responds by indicating the configurations, voltage and current pairs, that it supports.

In a fourth step (block 54, CONTROL PDOS), the apparatus checks that the received power supply configurations are compatible with standardized power supply configurations.

According to an embodiment variant, the apparatus supplies the device with power and tests the power supply configurations in turn.

During these tests, an undervoltage value (Under voltage, UVLO) and an overvoltage value (Over Voltage, OVLO) are associated with the tested power supply configuration PDO. In the case of a power supply configuration PDO comprising a voltage of 5 volts, the undervoltage value UVLO is equal to 4.25 volts and the overvoltage value OVLO is equal to 5.75 volts. For each further power supply configuration PDO, the undervoltage value UVLO is equal to the value of the voltage of the tested power supply configuration PDO minus ten percent. Similarly, the overvoltage value OVLO is equal to the value of the voltage of the tested power supply configuration PDO minus ten percent.

The apparatus verifies if the power supply received by the device to be supplied with power is comprised between the undervoltage value UVLO and the overvoltage value OVLO of the tested power supply configuration.

In the fifth step (block 55, SEND TEST RESULTS), the apparatus provides the results of the test procedure. The method of outputting the results of the test procedure can take different forms, examples of which will be described in relation to FIG. 8.

The results comprise: the role of the tested device; the power supply configurations supported by the tested device; and the compatibility of the device with standardized power supply configurations.

In cases (output N of block 52) where the apparatus determines that it is in the presence of a power supply device or a cable, the apparatus proceeds directly to the issue of the results of the test which comprise the role (power supply or cable) of the tested device.

Figure 6:
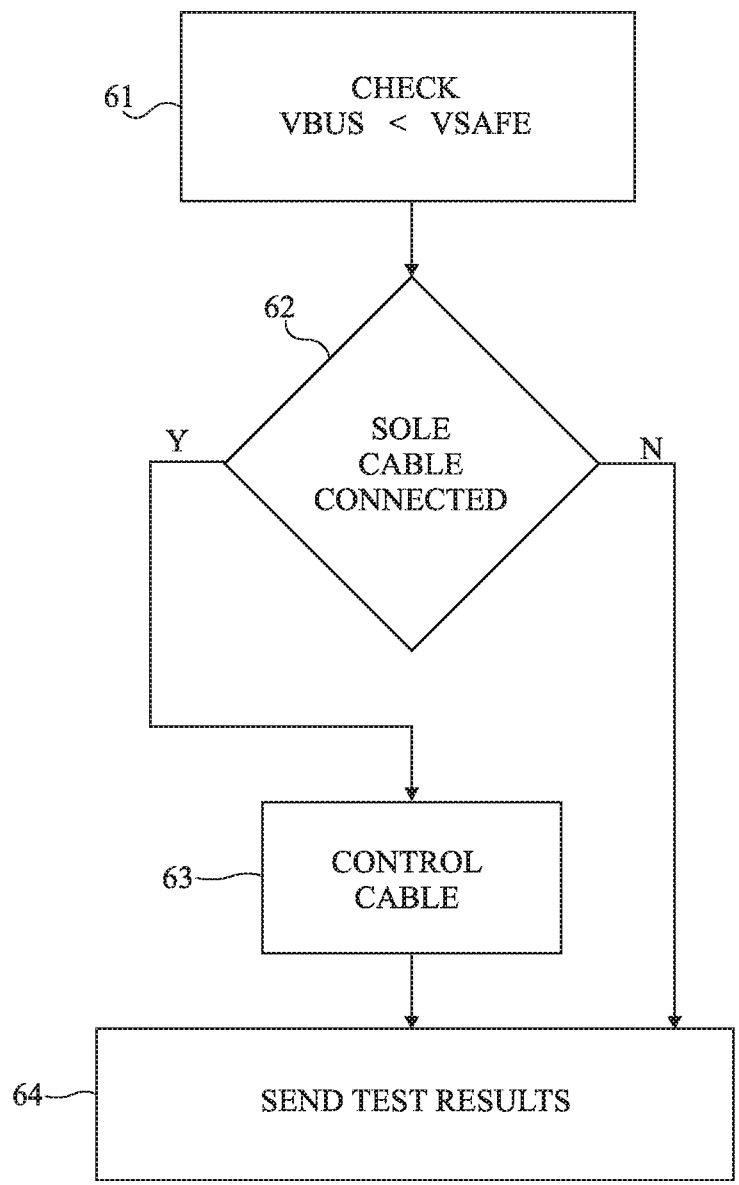
FIG. 6 is a flowchart illustrating steps of an embodiment of a test procedure for a USB Type-C cable.

FIG. 6 is a flowchart illustrating steps of an embodiment of a test procedure for a USB Type-C cable.

This test procedure is implemented by an apparatus, for example a dongle, adapted to test a USB Type-C cable. The apparatus comprises an emitter circuit for communicating with the cable. The apparatus comprises at least one USB Type-C connector, configured to be connected to the USB Type-C cable. The cable is separate from the apparatus.

In a first step (block 61, CHECK VBUS<VSAFE), once a device is connected, the apparatus verifies that the voltage VBUS of a power supply terminal (31, FIG. 3) of the connector is lower than a first threshold (VSAFE), also known as a safety value (Vsafe0V), for example of 0.9 volt. If the voltage VBUS is higher than the safety value Vsafe0V, the apparatus stops the test procedure and outputs an error.

In a second step (block 62, SOLE CABLE CONNECTED), the apparatus verifies that the device to which it is connected is a sole USB Type-C cable, in other words a USB Type-C cable that is connected to the apparatus and to no other device.

In order to verify that the device is a sole USB Type-C cable, the apparatus determines the role of the device. The role of the connected device, if applicable via a USB Type-C cable, can be: power supply device; device to be supplied with power; dual-role device; or sole USB Type-C cable, in other words an energy or data transmission device.

If the connected device is not a sole cable (output N of block 62), the test procedure moves directly to a fourth step (block 64, SEND TEST RESULTS), which will be described further below.

If the connected device is a sole cable (output Y of block 62), the test procedure moves to a third step (block 63, CONTROL CABLE).

In this third step 63 the apparatus determines if the connected cable is a cable configured to convey a current that can reach 3 amperes (3 A cable) or a cable configured to convey a current that can reach 5 amperes (5 A cable). A difference in the USB-PD standard concerning the 3 A and 5 A cables is that the 5 A cables include electronic circuits capable of communicating with a device to which they are connected, even when their other end is in the air. The emitter circuit of the apparatus sends a signal destined for the cable. If the apparatus does not receive a response, this generally indicates that either there is no device connected to the apparatus or that the apparatus is connected to a sole 3 A cable. In the described embodiment, when a cable is hooked up, the cable is thus considered a 3 A cable. If the apparatus receives a response, the cable is considered a 5 A cable.

In the fourth step (block 64, SEND TEST RESULTS), the apparatus provides the results of the test procedure. The method of outputting the results of the test procedure can take different forms, examples of which will be described in relation to FIG. 8.

The results comprise the role of the connected device. In the event that a sole cable has been detected, the results also comprise the type of cable (3 A or 5 A).

Figure 7:
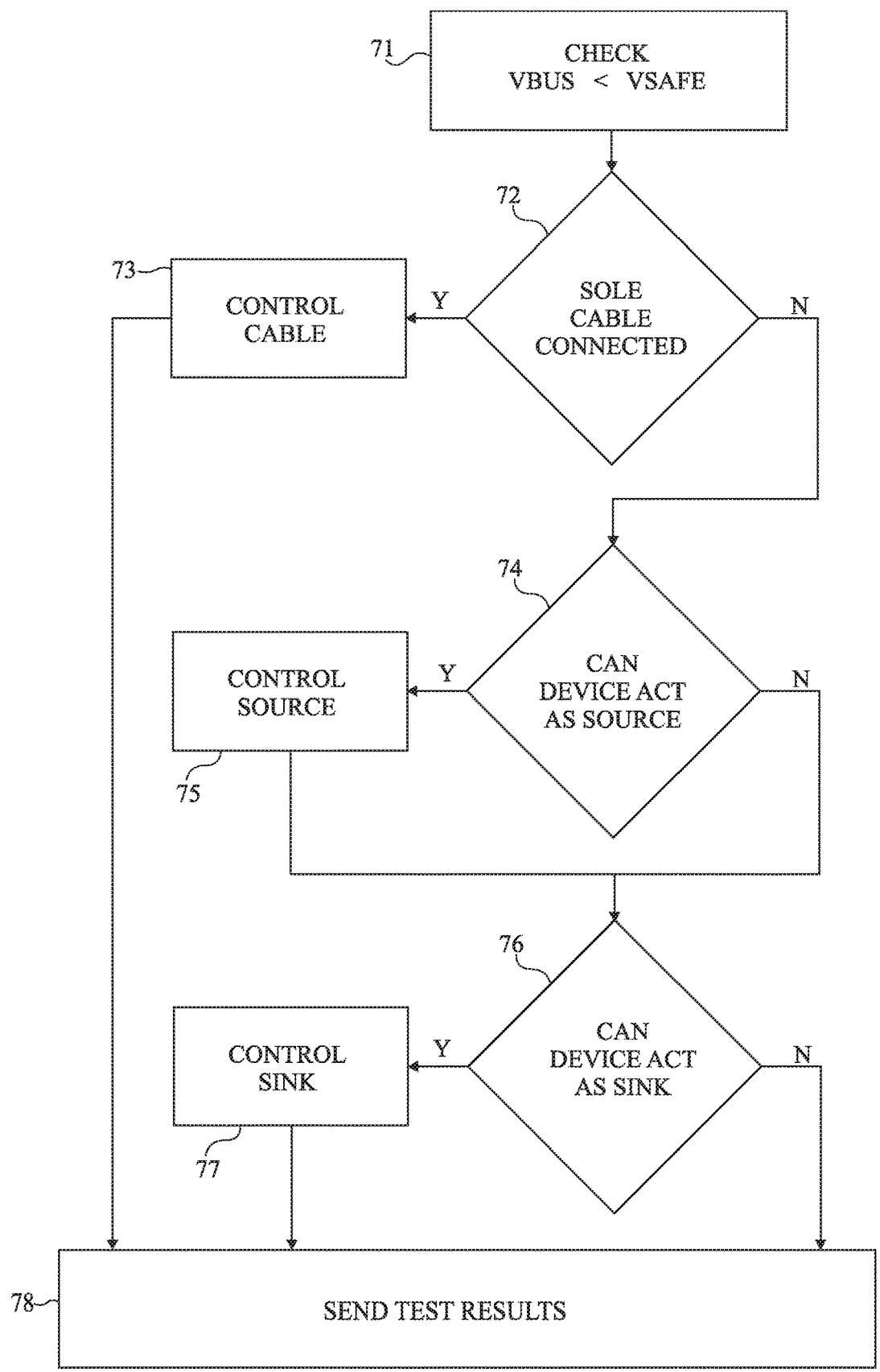
FIG. 7 is a block diagram of an embodiment of a test procedure for a USB-PD device.

FIG. 7 is a flowchart illustrating steps of an embodiment of a test procedure for a USB-PD device.

This test procedure combines the three test procedures described in relation to FIGS. 4, 5 and 6: test of power supply device; test of device to be supplied with power; and test of sole cable.

It is implemented by an apparatus, for example a dongle, adapted to test a USB-PD device. The device is separate from the apparatus.

According to an embodiment, the apparatus comprises at least one connector configured to be connected to a power supply device or to a sole cable and a further connector configured to be connected to a device to be supplied with power or to a sole cable, if applicable simultaneously.

According to a variant, the apparatus comprises at least one dual-role port configured to be connected to a power supply device or to a device to be supplied with power or to a sole cable.

In a first step (block 71, CHECK VBUS<VSAFE), once a device is connected, the apparatus verifies that the voltage VBUS of a power supply terminal (31, FIG. 3) of the connector is lower than a first threshold (VSAFE), also known as a safety value (Vsafe0V), for example of 0.9 volt. If the voltage VBUS is higher than the safety value Vsafe0V, the apparatus stops the test procedure and outputs an error.

In a second step (block 72, SOLE CABLE CONNECTED), the apparatus verifies that the device to which it is connected is a sole USB Type-C cable, in other words a USB Type-C cable that is connected to the apparatus and to no other device. This step is identical to the second step 62 of the test procedure for sole cables described in relation to FIG. 6.

If the connected device is a sole cable (output Y of block 72), the test procedure moves to a third step (block 73, CONTROL CABLE).

In this third step 73, the apparatus determines if the connected cable is a 3 A cable or a 5 A cable. This occurs as described in the third step 63 of the test procedure for cables described in relation to FIG. 6. The procedure then moves directly to an eighth step (block 78, SEND TEST RESULTS), which will be described herein.

If the connected device is not a sole cable (output N of block 72), the procedure moves to a fourth step (block 74, CAN DEVICE ACT AS SOURCE).

In this fourth step, the apparatus verifies that the function or role of the device to which it is connected is to supply power. This step is identical to the second step 42 of the test procedure for power supply devices described in relation to FIG. 4.

If the function of the connected device is to supply power (output Y of block 74), the test procedure moves to a fifth step (block 75, CONTROL SOURCE).

In this fifth step 75, the apparatus performs a power supply device check. This fifth step includes successively performing the third step 43, the fourth step 44 and the fifth step 45 of the test procedure for power supply devices described in relation to FIG. 4. Once the power supply device check has ended, the procedure moves to a sixth step 76.

In this sixth step (block 76, CAN DEVICE ACT AS SINK), the apparatus verifies that the role or function of the device to which it is connected is to be supplied with power. This step is identical to the second step 52 of the test procedure for devices to be supplied with power described in relation to FIG. 5. By this sixth step, it is possible in this case to process a dual-role device.

If the function of the connected device is not to supply power (output N of block 74), the test procedure moves directly to the sixth step (block 76, CAN DEVICE ACT AS SINK).

If the function of the connected device is to be supplied with power (output Y of block 76), the test procedure moves to a seventh step (block 77, CONTROL SINK).

In the seventh step 77, the apparatus performs a check of the device to be supplied with power. This seventh step includes successively performing the third step 53 and the fourth step 54 of the test procedure for devices to be supplied with power described in relation to FIG. 5. Once the device check for devices to be supplied with power has ended, the procedure moves to the eighth step (block 78, SEND TEST RESULTS).

In the eighth step 78, the apparatus supplies the results of the test procedure. The method of outputting the results of the test procedure can take different forms, examples of which will be described in relation to FIG. 8.

If the function of the connected device is not to be supplied with power (output N of block 76), the test procedure moves to the eighth step.

In the event that the tested device is a power supply device, the results comprise: the role of the tested device; the power supply configurations proposed by the tested device; the compatibility of the device with standardized power supply configurations; and the compatibility of the device with the proposed power supply configurations.

In the event that the tested device is a device to be supplied with power, the results comprise: the role of the tested device; the power supply configurations supported by the tested device; and the compatibility of the device with standardized power supply configurations.

In the event that the tested device is a dual-role device, the results comprise: the role of the tested device; the power supply configurations proposed by the tested device; the compatibility of the device with standardized power supply configurations; the compatibility of the device with the proposed power supply configurations; and the power supply configurations supported by the tested device.

In the event that the tested device is a sole cable, the results comprise: the role of the tested device; and the type of cable (3 A or 5 A).

The test procedure for USB-PD devices as described in relation to FIG. 7 is an example procedure combining procedures described in relation to FIGS. 4, 5 and 6. Other variants will occur to those skilled in the art. The different test steps can, for example, be performed in a different order. The apparatus can, for example, be equipped with a memory with which it is possible to store the role of the tested device in order to determine its role once.

Figure 8:
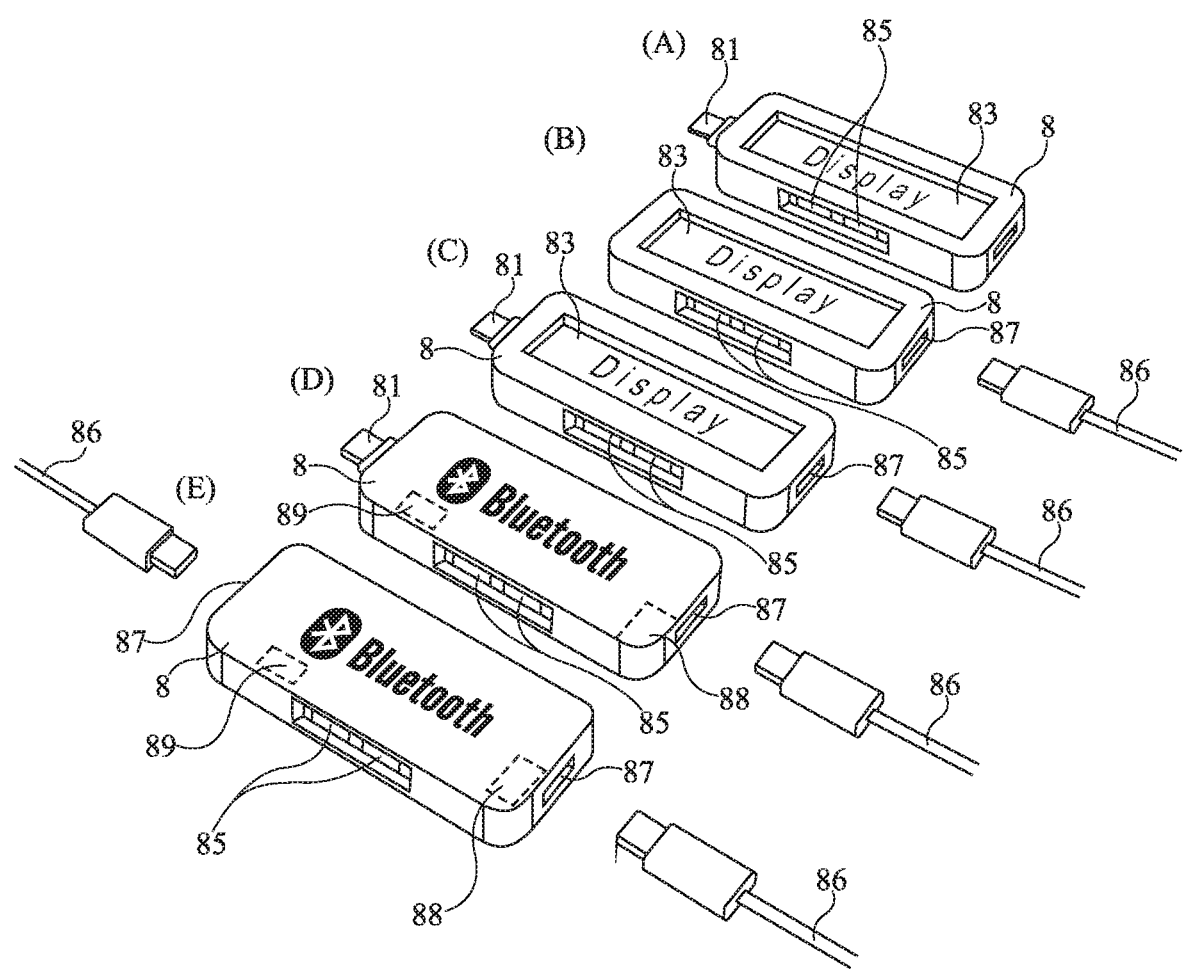
FIG. 8 illustrates a perspective view of a few embodiments of an apparatus for implementing test procedures.

FIG. 8 illustrates a perspective view of a few embodiments of an apparatus for implementing test procedures.

In the example shown in FIG. 8, five embodiments (A) to (E) of an apparatus 8 for implementing test procedures described in the foregoing are assumed. According to these embodiments, the apparatus takes the form of a dongle.

The first embodiment (A) is a dongle 8 comprising: a male USB Type-C connector 81; a display screen 83 (Display); and two buttons and/or LEDs 85.

The second embodiment (B) is a dongle 8 comprising: a female USB Type-C connector 87; a display screen 83 (Display); and two buttons and/or LEDs 85.

The third embodiment (C) is a dongle 8 comprising: a male USB Type-C connector 81; a female USB Type-C connector 87; a display screen 83 (Display); and two buttons and/or LEDs 85.

The fourth embodiment (D) is a dongle 8 comprising: a male USB Type-C connector 81; a female USB Type-C connector 87; a Bluetooth module 89; and two buttons and/or LEDs 85.

The fifth embodiment (E) is a dongle 8 comprising: two female connectors USB Type-C 87; a Bluetooth module 89; and two buttons and/or LEDs 85.

In embodiments (B) to (E), cables 86 are depicted that form either the device to be tested directly or a coupling to the device to be tested.

The five example embodiments (A) to (E) of the apparatus comprise at least one male or female, USB Type-C connector configured to be connected to a device to be tested. These embodiments comprise two buttons by which it is possible to monitor the apparatus and/or two LEDs, for example for indicating the state of an automatic check.

The five example embodiments (A) to (E) also comprise at least one method of outputting the test procedure results. This method of outputting takes, in these examples, at least a form from among: a display screen; a Bluetooth module; and an LED assembly.

With the display screen, it is possible to render and display results directly on the apparatus. The display system can, for example, be an LCD screen.

With the Bluetooth module, it is possible to transmit the result data in order to display them on a device external to the apparatus such as a portable computer, a smart phone, a tablet, etc.

With the assembly of LEDs, it is possible to display different colors as a function of the test results.

It will be noted that the apparatus can comprise a combination of more than one method of outputting.

According to further embodiments, the apparatus 8 can comprise at least one of the following components: a battery (88, views (D) and (E)); a circuit capable of emulating a device to be supplied with power; a circuit capable of emulating a power supply device; a dual-role USB Type-C connector; and an emitter circuit.

Figure 9:
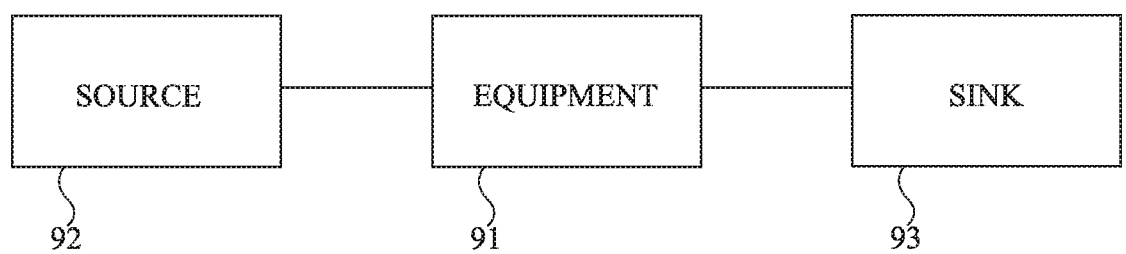
FIG. 9 schematically illustrates an embodiment of an apparatus forming an interface between a power supply device and a device to be supplied with power.

FIG. 9 illustrates, very schematically, an embodiment of an apparatus 91 including an interface between a power supply device and a device to be supplied with power.

The apparatus 91 (EQUIPMENT) comprises at least one first USB Type-C connector configured to be connected to a power supply device 92 (SOURCE). The apparatus comprises at least one second USB Type-C connector configured to be connected to a device to be supplied with power 93 (SINK).

The apparatus 91 is capable of implementing the procedures described in relation to FIGS. 4 to 7. The devices to be supplied with power and power supply devices to which it is connected are tested by the apparatus after being connected. Once the two devices have been tested and their power supply configurations determined compatible, the apparatus can: save the negotiated power supply configurations, in other words the power supply configurations proposed by the power supply device and the power supply configurations supported by the device to be supplied with power; continuously monitor the power supply terminal voltage (VBUS) of the power supply device and of the device to be supplied with power; monitor the current flowing from the power supply device toward the device to be supplied with power; and interrupt the connection between the two devices in the event of an overvoltage.

Figure 10A:
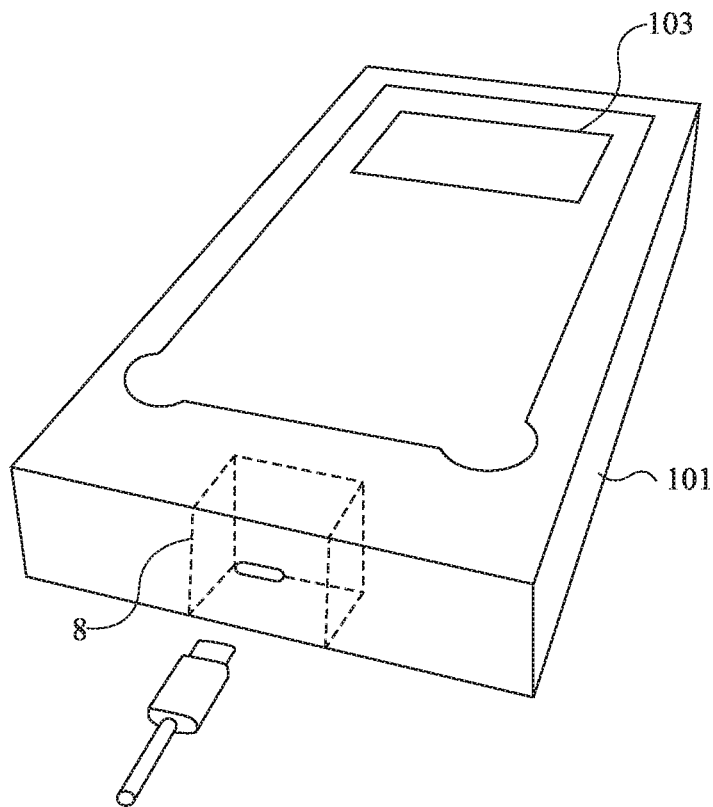
FIGS. 10A and 10B illustrate, via perspective views, further apparatus embodiments.
Figure 10B:
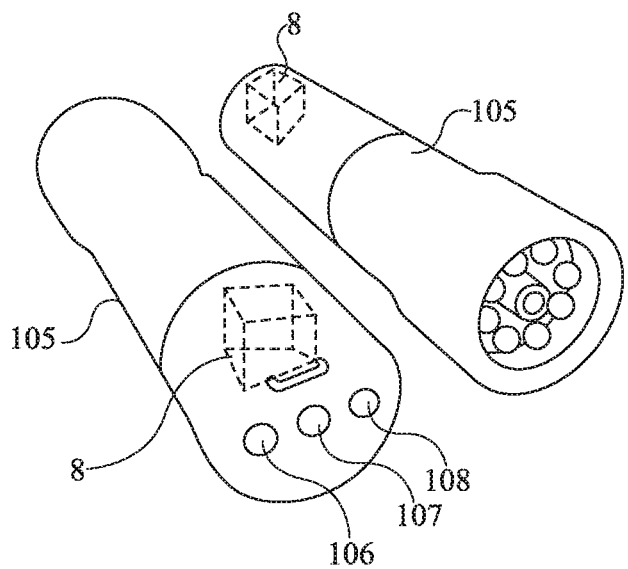

FIGS. 10A-10B illustrate, via perspective views, further apparatus embodiments.

FIGS. 10A and 10B are apparatus embodiments in which the apparatus is integrated in a device different from the device to be tested.

FIG. 10A is a perspective view of a multimeter 101 in which the apparatus 8 is integrated. The apparatus 8 uses, for example, the screen 103 of the multimeter 101 for outputting the results.

FIG. 10B illustrates perspective views respectively from the front and from behind, of a flashlight 105 in which the apparatus 8 has been integrated. The illustrated embodiment uses an assembly of LEDs 106, 107, 108 as a method of outputting the results, as described in the foregoing in relation to FIG. 8.

This assembly of LEDs is capable of: displaying a light of a first color, for example orange 107, when the test is in progress; displaying a light of a second color, for example green 106, if the proposed, or supported, power supply configurations of the tested device are compatible; and displaying a light of a third color, for example red 108, if the proposed, or supported, power supply configurations of the tested device are not compatible.

As a variant, the apparatus can be integrated in any electronic object such as a smart phone, an electronic cigarette, an external hard drive, an external battery (Power Bank), etc.

Various embodiments and variants have been described. Those skilled in the art will understand that certain features of these embodiments can be combined, and other variants will readily occur to those skilled in the art.

Finally, the practical implementation of the embodiments and variants described herein is within the capabilities of those skilled in the art based on the functional description provided hereinabove. In particular, the choice of the electric components used depends on the test procedures implemented.

The invention claimed is:

1. An apparatus for testing a first device capable of supplying power using Universal Serial Bus Power Delivery (USB-PD type), comprising:
   processing circuitry; and
   at least one first USB Type-C connector configured to be connected to the first device to be tested, said first device being separate from the apparatus, the at least one first USB Type-C connector comprising a power supply terminal;
   wherein the processing circuitry is configured to:
      verify that a voltage of a power supply terminal is less than a first threshold;
      identify a role of the first device, wherein the role of the first device is one of a power supply device, a device to be supplied with power, a dual-role device that is both supplied with power and supplies power, or an energy/data transmission device;
      in response to identification of the role of the first device as being a power supply device or a dual-role device that that is both supplied with power and supplies power:

simulate a second device, wherein the second device is to be supplied with power;

generate requests representative of power supply configurations for the first device;

verify compatibility of the power supply configurations with standardized power supply configurations; and verify compatibility of the first device with the power supply configurations by setting a role of the first device to be a device supplying power and causing the apparatus to be supplied with power from the first device.

2. The apparatus according to claim 1, wherein the apparatus and the first device operate in an autonomous manner with respect to each other.

3. The apparatus according to claim 1, wherein the apparatus comprises a battery.

4. The apparatus according to claim 1, wherein the at least one first USB Type-C connector is configured to be connected to a third device, wherein the third device is to be supplied with power to be tested.

5. The apparatus according to claim 4, wherein the processing circuitry of the apparatus is further configured to verify compatibility of the power supply configurations supported by the third device to be supplied with power to be tested with standardized power supply configurations.

6. The apparatus according to claim 5, wherein the apparatus further comprises at least one second USB Type-C connector.

7. The apparatus according to claim 6, wherein the apparatus forms an interface by simultaneously connecting the first device and the third device to be supplied with power.

8. The apparatus according to claim 7, wherein the processing circuitry is further configured to:

continuously monitor voltage at the power supply terminal of the first device and at a power supply terminal of the third device to be supplied with power; and interrupt the connection between the first device and the third device to be supplied with power if an overvoltage occurs.

9. The apparatus according to claim 1, wherein the apparatus further comprises an output device for providing results of the testing.

10. The apparatus according to claim 9, wherein the output device is a display screen.

11. The apparatus according to claim 9, wherein the output device is a Bluetooth module.

12. The apparatus according to claim 9, wherein the output device is an assembly of LEDs.

13. The apparatus according to claim 1, further comprising an emitter circuit for communicating with a USB cable connected to the at least one first USB Type-C connector.

14. The apparatus according to claim 13, wherein the processing circuitry of the apparatus is further configured determine a type of the USB cable.

15. The apparatus according to claim 1, wherein the apparatus further comprises a dual-role port.

16. A method of testing a device to be supplied with power via Universal Serial Bus Power Delivery (USB-PD), the method comprising:

connecting the device to be supplied with power to an apparatus for testing the device;

verifying that a power supply voltage provided to a power supply terminal of a USB Type-C connector connected to the device is lower than a first threshold voltage;

if the power supply voltage provided to the power supply terminal of the USB Type-C connector is higher than the first threshold voltage, ending testing of the device and outputting an error indication;

if the device is not capable of being supplied with power, ending testing of the device and outputting an indication that the device is connected to a sole USB cable or to power supply device; and if the device is capable of being supplied with power:

generating a request for power supply configurations addressed to the device;

receiving an indication of power supply configurations supported by the device;

verifying that the received power supply configurations are compatible with standardized power supply configurations;

setting a role of the device to be a device to be supplied with power; and supplying the device with power and testing the device with the received power supply configurations.

17. The method of claim 16, wherein testing the received power supply configurations is performed by verifying whether voltages received by the device are between undervoltage and overvoltage values of the received power supply configurations.

18. The method of claim 17, wherein if the device is capable of being supplied with power, the method further comprises outputting a role of the tested device, the power supply configurations supported by the tested device, and whether the received power supply configurations are compatible with the standardized power supply configurations.

* * * * *